United States Patent [19]

Vlakancic et al.

[11] Patent Number: 4,694,694

[45] Date of Patent: Sep. 22, 1987

[54] SOLID STATE ACCUMULATING ALTIMETER

[75] Inventors: Connor G. Vlakancic, San Jose; Ruy J. Pereira, Lafayette; Larry R. Goodman, Laguna Niguel, all of Calif.

[73] Assignee: Vertical Instruments, Inc., Lafayette, Calif.

[21] Appl. No.: 816,552

[22] Filed: Jan. 6, 1986

[51] Int. Cl.⁴ .................................................. G01L 7/12
[52] U.S. Cl. ........................................ 73/386; 73/721;
 73/727; 73/DIG. 4; 368/11; 368/14
[58] Field of Search ................. 73/386, 387, 179, 384,
 73/721, 727, DIG. 4; 368/11, 14, 10

[56] References Cited

U.S. PATENT DOCUMENTS

| 4,030,065 | 6/1977 | Bateman | 73/178 T |
|---|---|---|---|
| 4,106,343 | 8/1978 | Cook | 73/387 |
| 4,257,112 | 3/1981 | Hubner | 73/754 |
| 4,279,028 | 7/1981 | Lowdenslager et al. | 368/11 |

Primary Examiner—Donald O. Woodiel
Attorney, Agent, or Firm—Thomas M. Freiburger

[57] ABSTRACT

An altimeter device employs a solid state pressure sensor having a strain-sensitive element directly in a silicon diaphragm, which is connected at one side to a closed vacuum chamber. The entire device is very compact and may be in the form of a wristwatch. A display indicates altitude or relative altitude above or below a reference point to the user, and electronics associated with the device provide for accumulation of vertical change in one direction, regardless of intervening changes in the opposite direction. In this way, a skier, hiker or biker, for example, may determine total vertical drop or vertical rise encountered in a selected period, without regard to offset from movements in the opposite direction. At the same time, the user may also determine his altitude at any given point, and in a preferred form the altimeter device includes a clock and a time-averaging feature, for calculating and displaying rate of climb or descent, both instantaneous and average over a selected interval. The device may also have a time display, so that it functions as a wristwatch as well as an altimeter, and a synthesized voice output may be included for reporting data to the user's ear when visual observation of the display is not practical.

10 Claims, 7 Drawing Figures

SOLID STATE ACCUMULATING ALTIMETER

BACKGROUND OF THE INVENTION

The invention relates to altimeters, and more particularly to a solid state altimeter device sufficiently compact to be worn on the wrist and including additional features in conjunction with the altimeter function.

Various forms of altimeters are well known, particularly those for use in aircraft. Conventionally, altimeters have been mechanical in nature, essentially comprising an atmospheric pressure-responsive bellows connected mechanically to an indicator needle. Other altimeters have used a metal disk with strain gauges bonded to the disk.

More recently, there have been developed special solid sate pressure sensors or transducers, of smaller size than the conventional bellows. In these pressure transducers a strain-sensitive element or strain gauge has been encapsulated directly within a silicon member which acts as a diaphragm. Such transducers have been used to measure pressure differential between the two sides of the diaphragm.

For example, U.S. Pat. No. 4,303,903 discloses a solid state pressure transducer, not forming a part of an altimeter, but generally of the type employed in the present invention described below.

An altimeter showing the use of generally this type of solid state transducer is disclosed in U.S. Pat. No. 4,106,343. That altimeter, designed for aircraft use, included display of altitude, correction for barometric pressure, and a form of rate of climb indicator consisting of an array of LEDs.

U.S. Pat. No. 4,030,065 discloses an aircraft terrain clearance warning system having an automatic voice warning tied in with a radio altimeter.

Piezoresistance of a semiconductor can be described as the change in resistance caused by an applied strain of the diaphragm. Thus, solid state resistors can be used as pressure sensors much like wire strain gauges, but with seveal important differences and advantages.

High sensitivity, or gauge factor, in a semiconductor strain gauge is perhaps 100 times that of wire strain gauges. Piezoresistors are implanted into a homogeneous single cyrstalline silicon medium. The implanted resistors are thus part of the silicon force sensing member.

Prior conventional strain gauges typically were bonded to members of dissimilar material, resulting in thermo-elastic strain and complex fabrication processes. Most strain gauges are inherently unstable due to degradation of this bond, as well as temperature sensitivity and hysteresis caused by the thermo-elastic strain.

Silicon is an ideal material for receiving the applied differential pressure force. As a perfect crystal it does not contribute to hysteresis error. After being strained, it returns to the original shape.

Prior mechanical altimeters have been costly as compared with the present invention, and yet still have not performed all of the functions of the invention, usually being limited to reporting altitude and sometimes rate of climb.

Although some of the prior art included transducers or singular features relating to the present invention, none has disclosed or suggested an altimeter device of the compact design and having the advantageous features of the present invention, as described below.

SUMMARY OF THE INVENTION

The solid state altimeter device of the present invention is very compact and may be small enough to be wrist-worn, preferably in the form of a wristwatch. It employs a sensitive solid state pressure transducer with an attached evacuated chamber of special compact design. The device is particularly useful for skiers, hikers, and those involved in other activities wherein significant changes in altitude are encountered.

The altimeter device of the invention preferably includes an altitude accumulating feature whereby the user may set the device to accumulate vertical change in the up direction only or in the down direction only, and this is achieved by internal electronics, e.g., a microprocessor chip contained within a housing of the device.

In a preferred embodiment the altimeter device of the invention includes a time clock within the housing, and electronics for averaging altitude change with respect to time, for displaying to the user an instantaneous rate of climb or of descent. Preferably, the clock also is used for standard time keeping, with the time of day displayed to the user, so that the device functions as a wristwatch as well as having the altimeter functions.

The device of the invention may perform the rate calculation by measuring the time taken to descend (or ascend) a vertical interval, such as 20 feet, and this value can be displayed as "instantaneous" rate until the next interval's rate is calculated. The instrument can store peak rate by calculating the rate for each vertical interval and retaining the highest interval rate (over a user-selected larger interval) as the peak rate. Average rate of descent or ascent for the user-selected interval can be determined using the accumulated time over the user-selected interval. For purposes of average rate, periods of no change in altitude can be disregarded. For example, if there is no change in altitude over a preselected time period, such as 10 or 15 seconds, an assumption can be made that the user has stopped for that period of time, which can be omitted from the average rate calculation. Similarly, inaction for this period of time can function to tell the instrument the user has stopped, triggering a display of average rate.

The device can also include an optional stopwatch function for measuring the time taken to traverse a user-selected vertical interval. For example, the user might enter an upper and a lower altitude value and set the device to measure the time between those altitude values. Alternatively, the user may trigger the stopwatch function by punching a button at a start and at a stop location, and thereby setting the instrument to perform the stopwatch function each time the user passes between these two points, until the instrument is removed.

It is therefore among the objects of the invention to provide a compact, preferably wrist-worn altimeter having a selectable accumulator function and preferably also a clock for determining and displaying rate of climb or descent, and optionally the time of day. These and other objects, advantages, features and characteristics of the invention will be apparent from the following description of a preferred embodiment, considered along with the accompanying drawings.

DESCRIPTION OF PREFERRED EMBODIMENTS

Figure 1:
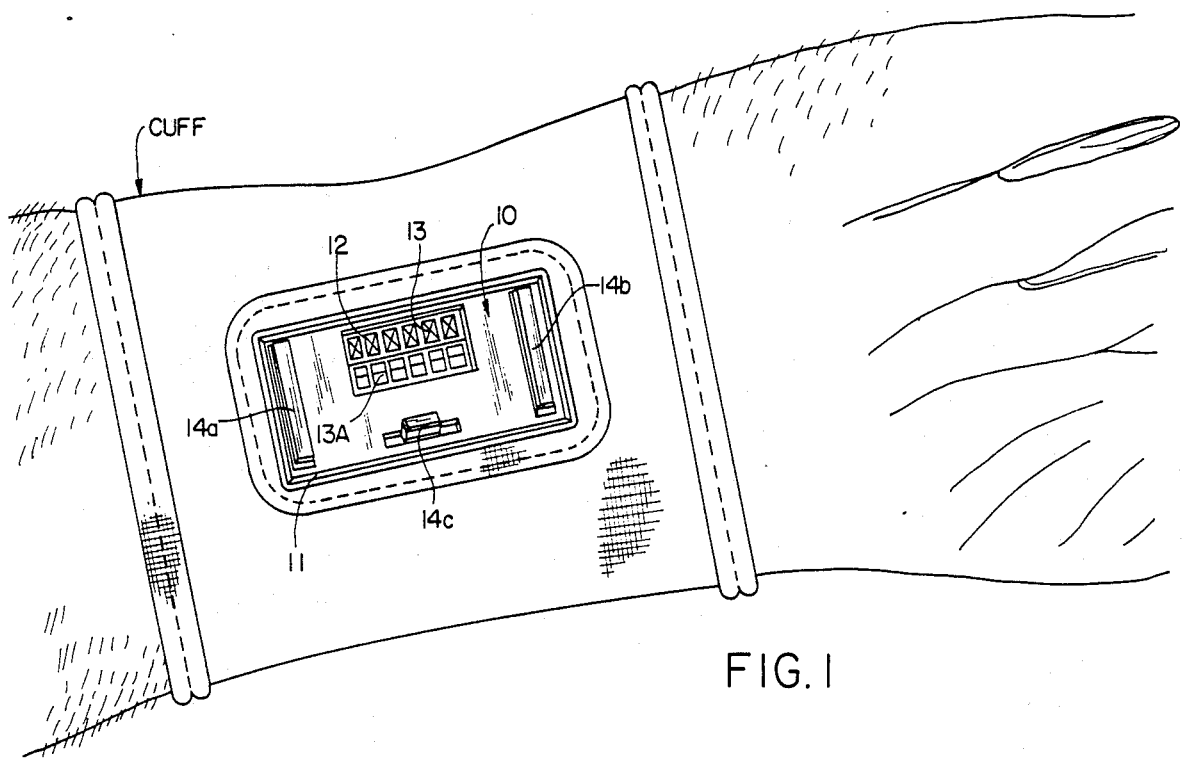
FIG. 1 is a perspective view showing an altimeter device in accordance with one embodiment of the invention, in the form of a wristwatch.

In the drawings, FIG. 1 shows an altimeter device 10 in accordance with the principles of the invention, shown in this embodiment in the form of a wristwatch. The altimeter device includes a housing 11, a transparent cover or crystal 12, a display 13 and manually operated buttons 14 for setting and calibrating the device and for selecting desired functions.

Figure 2:
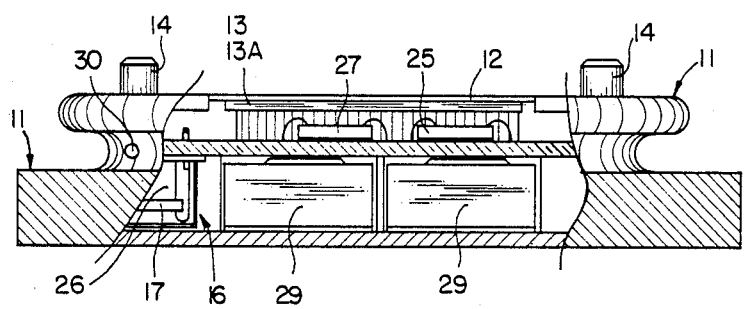
FIG. 2 is a view showing a portion of the inside working components of the altimeter device, including a solid state pressure transducer positioned within the housing of the device.
Figure 3:
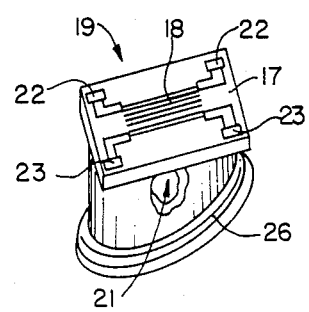
FIG. 3 is an enlarged perspective view showing the solid state pressure transducer.

FIGS. 2 and 3 show a solid state pressure sensor or transducer included in the device, generally indicated by the reference number 16. The transducer 16 is very compact in size and shape so as to be contained within the housing 11 of the device, even in the preferred form of a wrist instrument as illustrated. The solid state transducer 16 includes a silicon diaphragm 17 within which is encapsulated a strain gauge or strain responsive resistance element 18 whose resistance will change with changes in flexure of the diaphragm 17. The strain resistance element 18 is extremely sensitive, and will indicate very accurately changes in pressure differential, and the degree of changes in pressure differential, between an atmospheric side 19 and a vacuum side 21 of the diaphragm.

The silicon chip includes conductors (indicated at 22 and 23 in FIG. 3) operably connected to the strain resistance element 18 for connection to other electronics generally indicated as 24, contained within the device's housing 11.

At the vacuum side 21 of the transducer diaphragm 17, the diaphragm is connected across a closed vacuum chamber 26, which preferably is substantially evacuated (the chamber is shown inverted in FIG. 2). In accordance with the invention, the chamber 26 is of a special compact design for use with the compact altimeter device 10 of the invention, and it may be configured generally as shown in FIGS. 2 and 3.

Preferably, in the manufacture of the altimeter device 10, the transducear diaphragm 17 is die-attached in sealed relationship to the vacuum chamber 26 in a low-pressure, substantially evacuated environment. This enables the preferred configuration of chamber 26 to be used, having only one open end, which mates with the diaphragm. An alternative is to have a second opening in the chamber for evacuation and sealing of the chamber after the diaphragm 17 has been attached. The vacuum can be applied to either side of the diaphragm 17.

Figure 4:
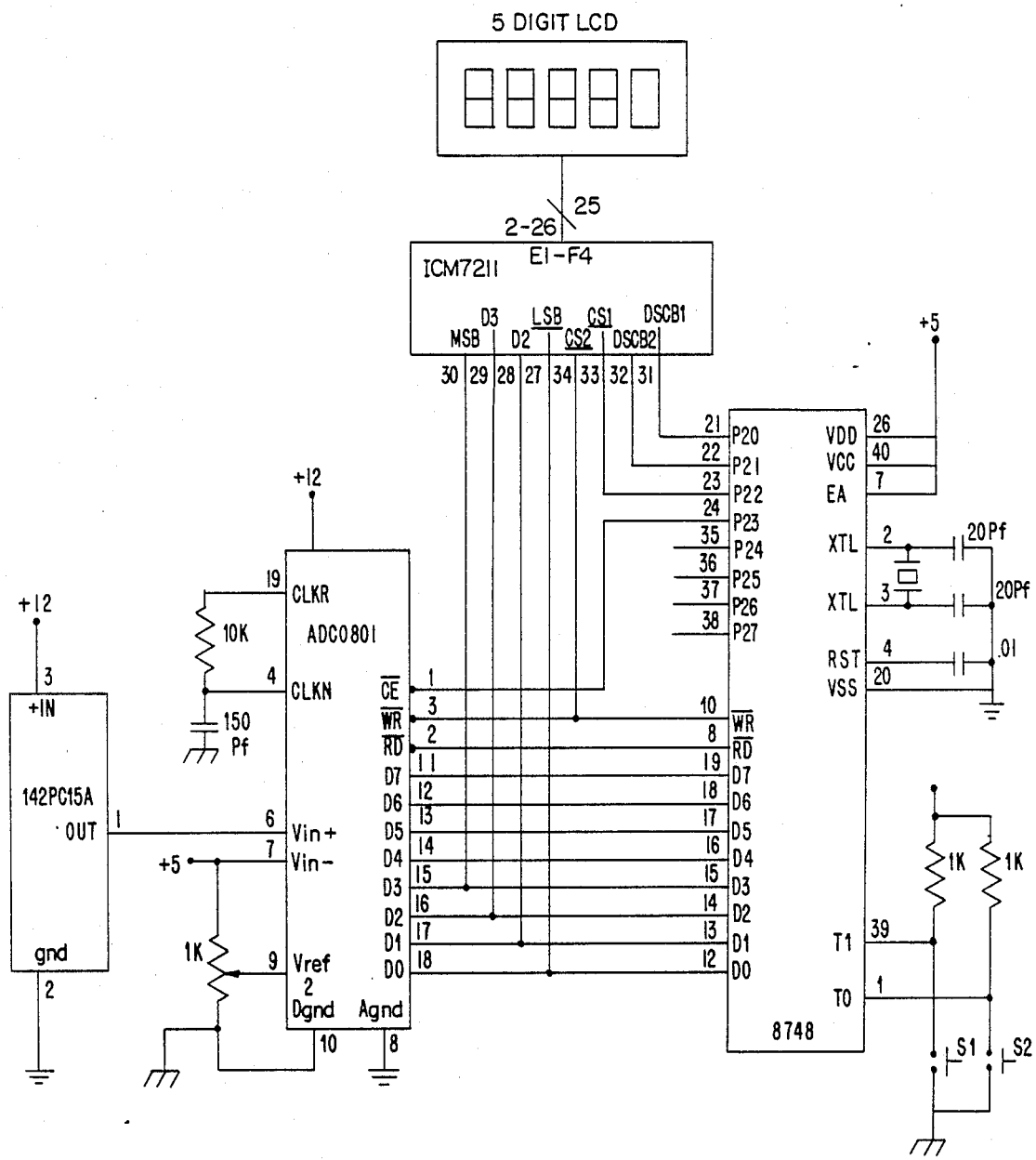
FIG. 4 is a schematic diagram indicating generally some of the circuitry associated with the altimeter device of the invention.

Electronics included in the device 10 preferably are embodied in a specially designed silicon chip 25 as indicated in the drawings. The circuitry for the chip may be as generally outlined in FIG. 4, showing off-the-shelf integrated circuits generally available in the industry.

As discussed above, the altimeter device 10 of the invention preferably includes a means for accumulating altitude change in one direction, irrespective of intervening movement in the opposite direction. For example, a skier may wish to determine the total of amount of vertical descent traveled in one day or for a selected period, and this is made possible with the device of the invention. The selector buttons 14, including buttons 14a, 14b, 14c as indicated in FIG. 1, enable the user of the altimeter to select the desired display function.

As illustrated generally in the drawings, the display 13 may include a liquid crystal display or other display technology for indicating altitude, accumulated altitude change, or other functions as described below. One such display may perform all functions, with the display function changed by the buttons 14, or several displays may be included under the cover 12.

As shown in FIG. 1, there may be included two displays 13 and 13a, such as for displaying (on an alphanumeric display 13) the function selected along with (on a numeric display 13a) the numerical value associated with the selected function at 13.

There is preferably included within the housing 11 a clock timer chip indicated at 27 in FIG. 2, for providing a clock function used in calculation (by the microchip 25) of instantaneous rate of climb or descent, and also preferably for displaying time of day to the user, on the display 13a.

The microchip 25 is a microprocessor for accomplishing the functions of the invention. The chip 25 is connected in a circuit with the strain resistance element 18 and receives a resistance signal from the strain resistance element 18 and a battery or batteries 29. The resistance signal represents the degree of strain in the element 18, representative of the differential pressure on the two sides of the transducer diaphragm 17. The resistance signal is an analog variable signal which is converted by the microprocessor chip 25 into an appropriate altitude figure.

Calibration of the displayed altitude, such as in accordance with a known reference elevation as a starting point for a skier, hiker, etc. is provided via one of the buttons 14. For example, the button or switch 14c may be used to turn power on, which may be effective to reset a "zero" starting altitude at a selected location for purposes of daily altitude change accumulation. Alternatively, in a different embodiment a wrist instrument contemplated by the invention may be programmed to display absolute altitude constantly on one display, while the other display indicates accumulated vertical change. A display of absolute altitude above sea level will require a calibration, and this can be accomplished by using a known altitude reference point, or the system can be programmed to receive an input of barometric pressure, from which the microprocessor will determine altitude. In such an embodiment provision is made for setting the display to read absolute altitude or barometric pressure.

The buttons 14a and 14b, which may be wide and prominent on the face of the device 10 for manipulation while wearing ski gloves, can be for selecting what is to be displayed.

As indicated in FIG. 2, the housing 11 includes some form of vent opening 30 so that atmospheric pressure is always communicated to the outside of the transducer diaphragm 17.

Figure 5:
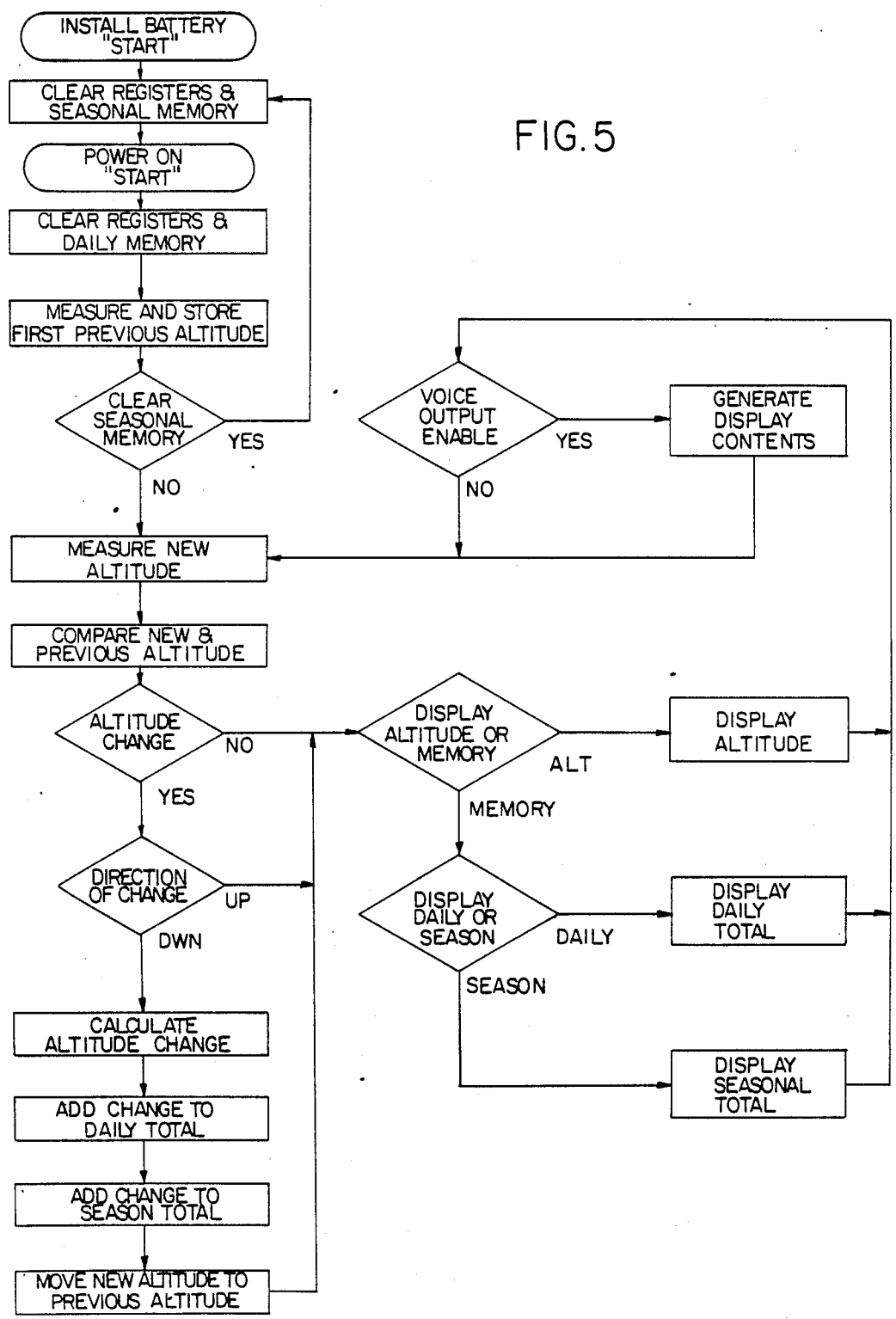
FIG. 5 is a flow chart or logic diagram relating to the programming of a microprocessor included in the altimeter device, for accomplishing some of the functions associated with the invention.

FIGS. 4 and 5 schematically indicate forms of circuitry and programming logic that may be used, in accomplishing the primary objectives of a preferred embodiment of the invention. These figures are intended to provide an outline only and it will be appreciated by those skilled in the art that any suitable form of programming may be used for the microprocessor chip 27, and such programming is well within the skill of the programmer.

In the flow chart of FIG. 5, a preferred logic for accumulating altitude change and displaying altitude, daily accumulted altitude or seasonal accumulated altitude is outlined.

As indicated in the initial logic entry point in FIG. 5, the installation of a battery into the device 10 starts certain operations. The battery supplies power to clear number storage registers and seasonal memory, in a preferred embodiment wherein a memory accumulates a daily total of altitude change in one direction, and a seasonal memory (e.g., an entire ski season) accumulates over a longer period.

With these functions accomplished, the user may then turn the power on to "start" the operation of the device, which is effective to clear additional registers relating to daily memory. The next function of the device is to measure and store a first previous altitude, to be used in the initial altitude change calculation.

The decision box following indicates the user's ability to deliberately clear seasonal memory if desired at this point, as an alternate method to the removal and replacement of the battery as mentioned above.

If seasonal memory is not manually and deliberately cleared at this point, the device then proceeds to measure a new altitude, then to compare the new and previous altitude and to calculate an altitude change. If there is no altitude change, the device simply displays the function that has been selected by switch positions. For example, it may display altitude (relative altitude) or memory, in which may be stored either the daily or the seasonal total altitude change. As indicated in FIG. 5, any of these three display functions can be selected by the user, as by manipulation of the buttons 14 illustrated above.

If there has been an altitude change as determined by the comparison of new and previous altitudes, the device next determines the direction of change, i.e., up or down. If the change is in the up direction, this is disregarded in this preferred embodiment of the invention, which is exemplified for use by skiers desiring a recording of accumulated altitude change in the down direction. If however, the direction change is down, the device calculates the altitude change, adds the amount of change to the daily total, adds the amount of change to the seasonal total, and then moves the new altitude to the position of previous altitude, for the purpose of the next altitude measurement and comparison.

Logic flow continues to display the selection as described above.

An optional electronic voice, which may be included to call out the display function verbally to the user, is represented in the decision and function blocks in the upper right of FIG. 5. The signals which flow to the display also are input to a voice output enable decision switch, so that if desired, the electronic voice will generate the contents of the display audibly to the user.

Figure 6:
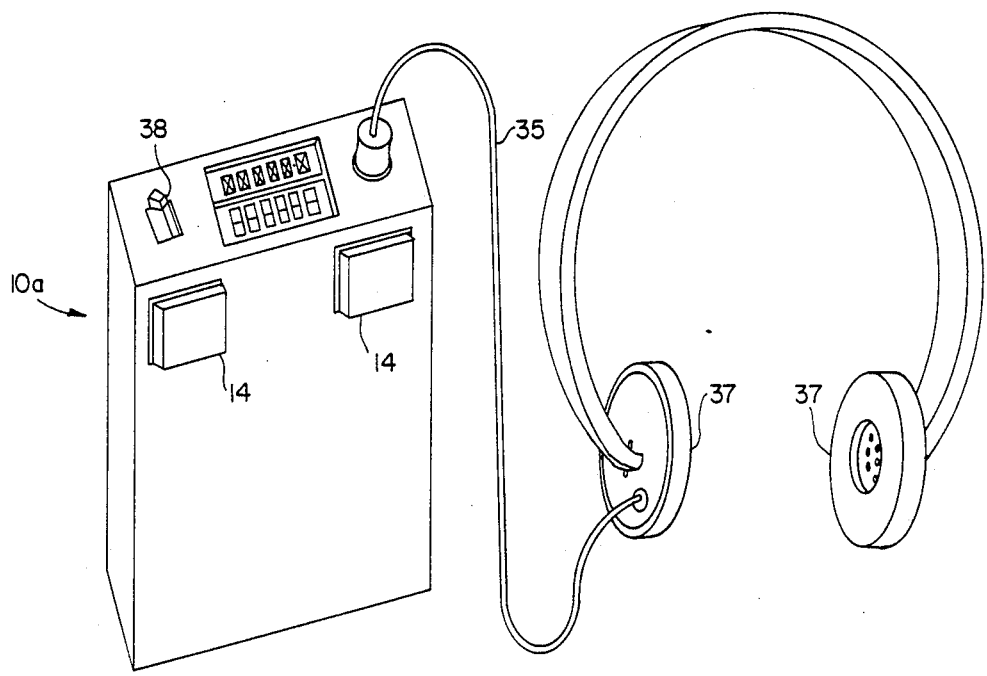
FIG. 6 is a perspective view indicating an optional feature of the invention wherein a simulated voice is generated and conducted through earphones to the user, for calling out desired information to the user, such as rate of descent or climb without the user having to read the display visually.

FIG. 6 shows an altimeter device 10a in another embodiment of the invention, which includes the above-mentioned voice synthesizer feature whereby a wire pair 35 may be plugged into the housing 11a of the device as indicated, leading to one or a pair of earphones 37 to be worn on the head of the user. The unit 10a may be approximately sized to fit in a shirt pocket of the user. The user selects "voice" by manipulating a switch 38, and in this way he is able to have certain selected information called out to him at intervals or upon the touch of one of the buttons 14. This enables the user to obtain rate of descent information, for example, while he is skiing down a ski slope. It enables a user to obtain any of the desired information calculated by the device 10a when he is unable to conveniently expose the display of the device 10a to view and read the information visually.

Figure 7:
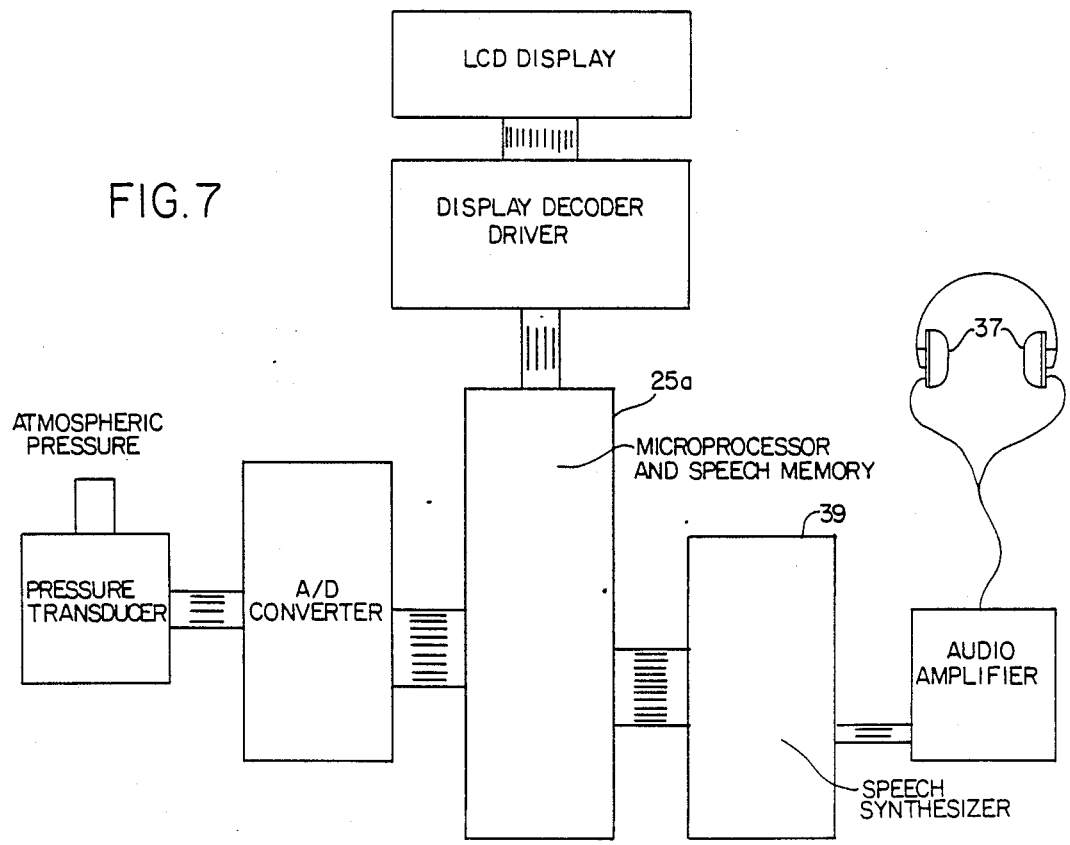
FIG. 7 is a schematic block diagram indicating circuitry associated with the simulated voice.

FIG. 7 is a block diagram representing the major components for the embodiment described with reference to FIG. 6, including the voice synthesizer. A separate voice synthesizer chip 39 may be included within the housing of the device 10a. As is well known in the art, such a synthesizer generates the characteristics of a voice, with all numbers and words needed for the desired function. A microprocessor chip 25a programmed to include speech memory simply sends an appropriate signal to the voice synthesizer chip 39, which in turn generates a voice simulation representing the numbers or combinations of numbers and words needed to send the message through the earphones to the user.

The above described preferred embodiments are intended to illustrate the principles of the invention, but not to restrict the scope of the invention, which is defined in the following claims.

We claim:

1. A solid state altimeter device, comprising:

an integrated circuit solid state pressure sensor including a deformable silicon diaphragm with a semiconductor strain gauge in the diaphragm;

a vacuum chamber operatively attached to the diaphragm such that the vacuum of the vacuum chamber is applied to one side of the diaphragm, with the opposite side of the diaphragm exposed to atmospheric pressure;

electrical means connected to the semiconductor strain gauge for conducting an analog signal from the strain gauge representing pressure difference between atmospheric and the vacuum chamber;

a housing containing the pressure sensor and the vacuum chamber;

microprocessor means in the housing for receiving the signal from the electrical means and for converting the signal into an altitude value;

display means mounted in the housing and connected to the microprocessor means for displaying values as controlled by the microprocessor means, to a user;

calibration means connected to the microprocessor means for enabling the user to manually calibrate the altimeter device to a reference value; and accumulator means included in the microprocessor means for accumulating altitude change in one direction, disregarding altitude changes in the opposite direction, for a selected interval, and including an accumulation display associated with the display means for displaying said altitude change in one direction.

2. The altimeter device of claim 1, wherein the accumulator means include means for accumulating and displaying altitude changes in the down direction and separately in the up direction, and for enabling the user to read either up or down total accumulated altitude changes.

3. The altimeter device of claime 1, further including a clock in the microprocessor means, and the microprocessor means including time averaging means for computing and displaying on the display means a rate of change in altitude over a selected interval.

4. The altimeter device of claim 3, further including rate storage means for enabling the user to cause altitude rate of change information for a selected interval to be stored and later displayed.

5. The altimeter device of claim 3, further including clock display means connected to said clock, for displaying real time to the user, whereby the device may function as an altimeter, an altitude change accumulator, a rate of altitude change indicator and a clock for the user.

6. The altimeter device of claim 5, wherein the housing comprises a generally wristwatch-sized housing with a band for retaining the device on the user's wrist.

7. The altimeter device of claim 1, wherein the housing comprises a generally wristwatch-sized housing with a band for retaining the device on the user's wrist.

8. The altimeter device of claim 7, further including a clock and a time display, whereby the device functions as an accumulating altimeter and as a wristwatch for the user.

9. The altimeter device of claim 1, further including a voice synthesizer connected to the microprocessor for generating a voice for conveying to the user information generated by the microprocessor.

10. The altimeter device of claim 1, further including an analog to digital converter in the microprocessor means, and means included in the display means for displaying the altitude as converted.

* * * * *